United States Patent [19]
Samuels

[11] Patent Number: 5,929,707
[45] Date of Patent: Jul. 27, 1999

[54] AMPLIFIER SYSTEM WITH CONTROLLED REACTANCE

[75] Inventor: John Samuels, Surrey, United Kingdom

[73] Assignee: Nokia Mobile Phones Limited, Espoo, Finland

[21] Appl. No.: 08/924,809

[22] Filed: Sep. 5, 1997

[30] Foreign Application Priority Data

Sep. 20, 1996 [GB] United Kingdom .................. 9619705

[51] Int. Cl.$^6$ .................................................. H03G 3/12
[52] U.S. Cl. ............................................. 330/283; 330/95
[58] Field of Search ................................ 330/86, 94, 95, 330/283; 375/345; 455/250.1, 252.1

[56] References Cited

U.S. PATENT DOCUMENTS

| | | | |
|---|---|---|---|
| 3,023,369 | 2/1962 | Horowitz | 330/283 |
| 3,571,721 | 3/1971 | Jabbar | 330/283 X |
| 3,671,886 | 6/1972 | Fudemoto et al. | 333/18 |
| 3,774,118 | 11/1973 | Van Doorn | 330/95 X |
| 4,409,557 | 10/1983 | Sechi | 330/277 |
| 5,241,284 | 8/1993 | Nyqvist et al. | 330/297 |
| 5,339,048 | 8/1994 | Weber | 330/302 |

FOREIGN PATENT DOCUMENTS 1908924   11/1969   Germany.
WO 81/01916
A1   7/1981   WIPO.

OTHER PUBLICATIONS

"Mobile Star Wars", What Cellphone, Sep. 1996, pp. 60–66.
"Mobile P–System Satellite System Comparison", International Journal of Satellite Communications, vol. 13, pp. 453–417 (1995), Klaus G. Johannsen.
"Adaptive Compensation For Microwave Linearizer", Buoli C et al., European Microwave Conference Management Committee, Sep. 06, 1993, pp. 439–442, XP000629958.

Primary Examiner—Steven J. Mottola
Attorney, Agent, or Firm—Perman & Green, LLP

[57] ABSTRACT

An amplifier system for a radio receiver, comprising: an amplifier for amplifying a signal applied to an amplifier input to generate an amplifier output signal; a variable reactance means coupled between the emitter or source of the amplifier and a ground voltage; and a feedback loop for sensing the amplifier output signal and, in response to a relatively high level of the output signal, controlling the reactance of the variable reactance means to maintain the amplifier in a substantially linear mode of operation.

18 Claims, 3 Drawing Sheets of the present invention. The signal receiver
AMPLIFIER SYSTEM WITH CONTROLLED REACTANCE

BACKGROUND OF THE INVENTION

This invention relates to an amplifier system, especially an adaptive amplifier system for a signal receiver, for example a portable telephone handset or satellite receiver.

A radio signal receiver typically includes a chain of filter stages and amplifier stages ("gain stages") through which the received radio frequency signal is passed in series. The filter stages and amplifier stages alternate throughout the chain. The filters filter out unwanted (out of band) frequencies and the amplifiers amplify the remaining signals. The resulting signal passes to a mixer where it is downconverted, and the signal is subsequently demodulated.

Signal receivers that are especially sensitive (those having a high degree of amplification through the chain) may suffer particular problems. To cope with the extreme sensitivity of the signal the receiver must have a very low noise characteristic (known as noise figure); otherwise the noise will tend to be amplified so that it swamps the signal. However, to achieve the required sensitivity relatively many gain stages may be required: possibly three or more gain stages in the receiver's UHF section alone, whereas a typical conventional mobile telephone has only one or two gain stages. And if a three gain-stage UHF section, for instance, is built using the same principles as a standard receiver section its IIP3 ("third order input intercept point") performance will be relatively poor (perhaps 20 dB worse than that of a comparable signal receiver with only one or two gain stages). Therefore, such a signal receiver will be especially vulnerable to interference from unwanted signals—especially signals just outside the band of desired frequencies. The problems will be particularly acute if the signal receiver's filters are low insertion loss filters with relatively little attenuation of signals just outside the desired band.

SUMMARY OF THE INVENTION

According to the present invention there is provided an amplifier system for a radio receiver, comprising: an amplifier for amplifying a signal applied to an amplifier input to generate an amplifier output signal; a variable reactance means coupled between the emitter or source of the amplifier and a ground voltage; and a feedback loop for sensing the amplifier output signal and, in response to a relatively high level of the output signal, controlling the reactance of the variable reactance means to maintain the amplifier in a substantially linear mode of operation.

The variable reactance means suitably comprises a variable reactance element, preferably a variable capacitance element, most preferably a varactor. The variable reactance means preferably comprises a resonant circuit. The resonant circuit preferably comprises inductive and capacitive limbs connected in parallel. The inductive limb suitably comprises an inductance (which could be provided by one or more via holes). Preferably that is the only component in the inductive limb. The inductance of the inductive limb is preferably in the range from 0 to 2.5 nH, most preferably 1 nH or less. The capacitive limb preferably comprises a capacitor and a varactor connected in series.

Preferably, in response to a relatively high level of the output signal the feedback loop causes the effective inductance of the variable reactance means to increase.

The feedback loop suitably comprises sensing means for sensing the level of the output signal (suitably the voltage level of that signal) and generating a voltage dependant on that signal. The capacitance of the said varactor is preferably controlled by a control voltage derived from the output of the sensing means. The control voltage is preferably applied to one terminal of the varactor. The other terminal of the varactor is preferably connected to the ground voltage.

The amplifier may be part of an amplifier means which preferably includes one or more filters. The amplifier means is preferably part of a chain of two or more amplifiers, in which case the said amplifier is preferably the amplifier furthest from the input to the chain.

The said amplifier preferably comprises a transistor. If the transistor is a bipolar transistor then the variable reactance means is suitably coupled between the emitter of the transistor and the ground voltage. If the transistor is a field effect transistor then the variable reactance means is suitably coupled between the source of the transistor and the ground voltage.

Preferably, only in response to a relatively high level of the output signal does the feedback loop have a substantial effect on the linearity of the amplifier.

The amplifier system is suitably part of a signal receiver, preferably a radio signal receiver, which may constitute a second aspect suitably comprises at least two, and preferably at least three, gain stages coupled in series, suitably between an antenna and a first (or only) mixing means. The said amplifier is preferably an amplifier of which ever of those gain stages is closest to the mixing means. The mixing means preferably downconverts the received signals to provide an intermediate-frequency signal. The amplifier system is preferably part of a handset, such as a radio telephone (or "mobile telephone" or "portable telephone") or a pager.

Satellite/mobile telephones demand especially sensitive signal receivers and because of the difference in signal strengths between terrestrial radio signals and signals received from satellites may suffer particularly from problems due to strong out of band interference. For example, one proposed satellite/mobile telephone service is proposed to operate at 2170–2200 MHz and the proposed UMTS terrestrial/satellite telephone network is proposed to operate adjacent to that frequency band. 100 m from a base station the UMTS signal strength may be greater than −30 dBm and since the typical signal strength at the Earth's surface of the satellite/mobile telephone service may be −100 dBm the UMTS signals are likely to present strong potentially interfering signals to a satellite/mobile telephone.

Therefore, an amplifier system or signal receiver according to the present invention may advantageously be included in a receiver for signals from a satellite, and/or a satellite/mobile phone.

BRIEF DESCRIPTION OF THE DRAWINGS

The present invention will now be described, by way of example only, with reference to the accompanying drawings in which.

DETAILED DESCRIPTION OF THE INVENTION

The embodiment of the invention that is illustrated in the figures is an amplifier system for a satellite/mobile telephone handset. The amplifier system comprises a gain section which includes an amplifier. There is control circuit which has a variable reactance means arranged so that it can be used to control the linearity of the amplifier's response; and a sensor for sensing the level of the signal output by the amplifier and as the level rises increasing the inductance of the variable reactance means in order to improve the amplifier's linearity.

Figure 1:
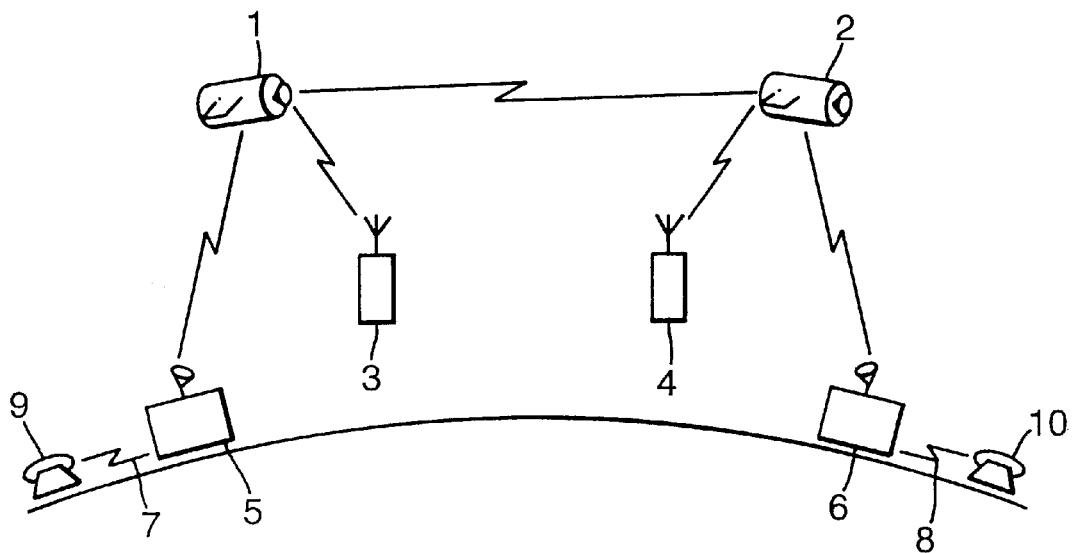
FIG. 1 is a schematic block diagram of a satellite/mobile telephone system.

Referring to FIG. 1, the satellite/mobile telephone system has earth-orbiting satellites 1,2 which may communicate with each other, with telephone handsets 3,4 and with gateways 5,6 to land-line telephone systems 7,8. (In practice the system would typically have more than two satellites and would support numerous mobile telephones.) Through communication with the satellites the mobile telephones can make and receive telephone calls between each other, and to and from telephones 9,10 connected to the land-line systems. Such systems are discussed generally in "Mobile P-System Satellite System Comparison"; International Journal of Satellite Communications, Vol. 13, 453–471 (1995) and "Mobile Star Wars"; What Cellphone, September 1996, pp 60–66.

The distance between any of the mobile telephones and the satellite with which it must communicate may be 40,000 km or more, depending on the altitude of the satellite's orbit and the number of satellites the system employs. Therefore, compared to terrestrial mobile telephone systems the signal received by satellite/mobile telephones will typically be of a relatively low strength and more prone to interference.

Figure 2:
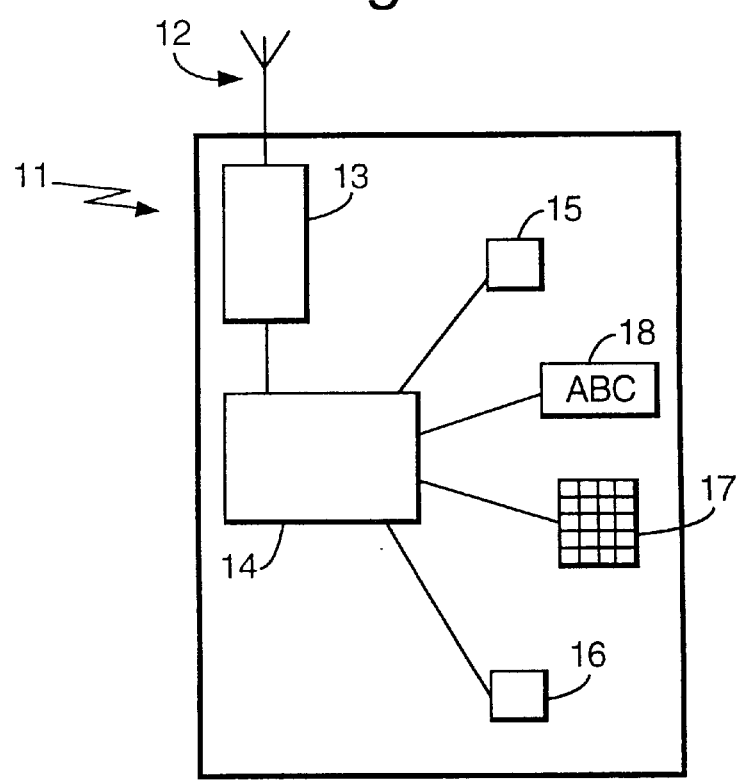
FIG. 2 is a schematic block diagram of a satellite/mobile telephone handset.

Referring to FIG. 2, a satellite/mobile telephone handset 11 (such as telephone handset 3 or 4 in FIG. 1) has an antenna 12; a radio frequency (RF) section 13 for processing the received signals down to baseband and for generating the RF signals to be transmitted by the antenna; and a processor section 14 which contains microprocessors for controlling the telephone and linking the RF section to a speaker 15 and microphone 16. A keypad 17 and display 18 are linked to the processor section to allow a user to control the telephone.

Figure 3:
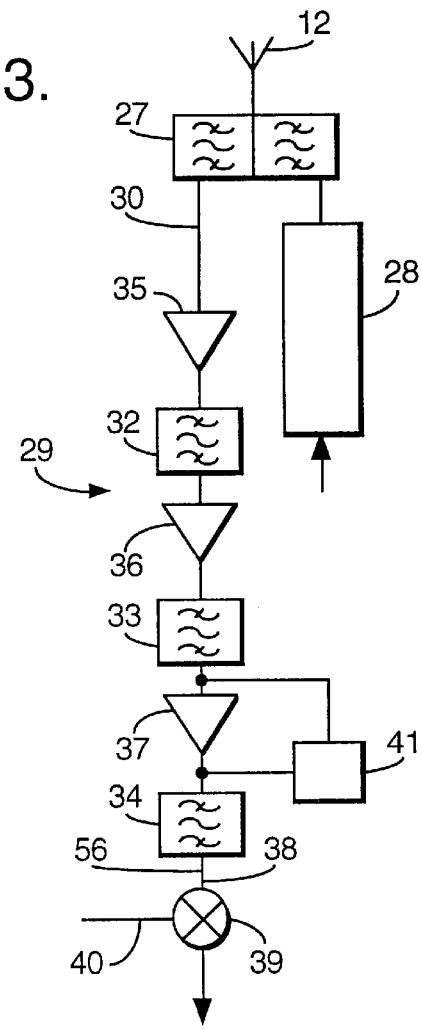
FIG. 3 is a schematic diagram of the electronic architecture of part of the telephone handset shown in FIG. 2.

FIG. 3 shows the RF section 13 of the telephone 11 in more detail. A duplexer 27 (or another suitable arrangement, such as a switch) connects the antenna 12 to a UHF transmitting circuit indicated generally at 28 and a UHF receiving circuit 29. In the receiving circuit, from the point 30, there is a chain alternating with band-pass filters 32,33, 34 and amplifiers 35,36,37. The signal output at 38 from the chain enters a mixer 39 where it is downconverted to an intermediate-frequency signal by mixing with a locally generated signal at 40.

Interference in the signal at 30 is likely to cause the greatest problem at amplifier 37 because the signal that is processed by that amplifier has already passed through two gain stages. To help overcome this problem the final gain stage has an additional control circuit 41 which is shown in more detail in FIG. 4.

Figure 4:
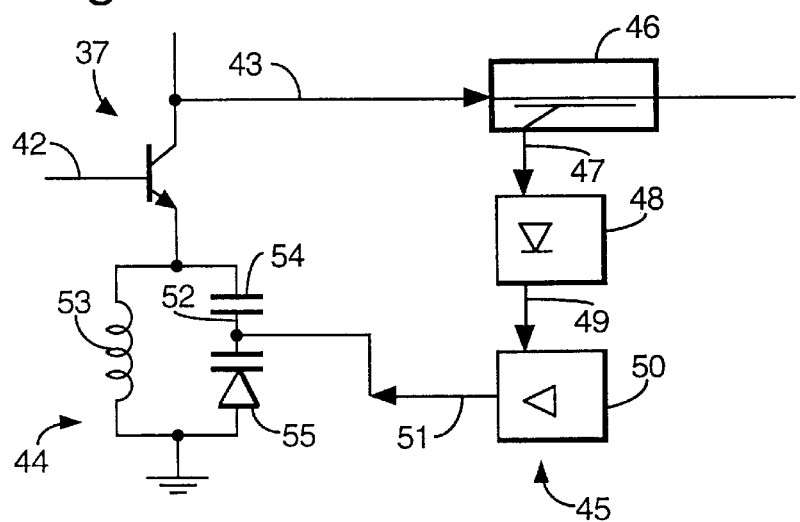
FIG. 4 shows in more detail a loop circuit for controlling the IIP3 of an amplifier of the telephone handset.

FIG. 4 shows the amplifier 37, in which amplification is provided by a bipolar transistor. The input 42 to the amplifier is connected to the base of the transistor and the output 43 from the amplifier is provided from the collector of the transistor. The emitter of the transistor is connected to ground through a resonant circuit 44, which forms part of an adaptive loop indicated generally at 45. In a typical prior art circuit the emitter of the transistor could be connected directly, or with a resistor, to ground.

In the embodiment of FIG. 4, a coupler 46 is arranged at the output 43 of the amplifier 37 to sense the signal output by the amplifier. The coupler provides an RF signal output at 47, which is coupled from the signal at output 43. The coupler is typically a coupler of around 15 dB.

The output of the coupler passes to a detector 48 which converts the output of the coupler to a voltage at 49 which is dependent on the level of the output at 43. The detector is, for example, a diode.

The voltage at 49 passes to a voltage gain circuit 50 (an amplifier, for instance) which amplifies (by, say, 20 times) changes in the voltage at 49. The voltage at 51 decreases as the voltage at 49 increases. In appropriate circuits the voltage gain circuit 50 could be omitted or provided by, for example, a difference amplifier.

The amplified signal at 51 is connected at 52 to the resonant circuit 44. The resonant circuit has two limbs connected in parallel. One limb is inductive and the other capacitive. One limb comprises an inductance 53 (this could be provided by a via hole) and the other comprises a capacitor 54 and a varactor diode 55 connected in series. The overall reactance $X_{TOTAL}$ of the resonant circuit is given by:

$$X_{TOTAL} = wL + 1/wC$$

where w is frequency, L is the inductance of the inductor and C is the overall capacitance of the capacitive limb. The amplified signal is introduced into the resonant circuit at a point between the varactor and the capacitor, so that a change in the voltage at 52 alters the capacitance of the varactor and therefore of the capacitive limb.

The operation of the control circuit 41 will now be described in more detail. When a strong interferer in the signal at 30 reaches amplifier 37 the voltage level of the amplifier's output signal, at the input to the coupler 46, will rise. As a result the level of the signal at 47 coupled from the signal at 43 will also rise, as will the voltage output by the detector 49, and the voltage output by the voltage gain circuit 51 will fall. This will cause the capacitance of the varactor 55 to increase, which will increase the effective inductance on the emitter of the amplifier 37. Hence, as a result of negative series feedback the linearity of the amplifier (as measured by its IIP3 for example) will tend to improve. The effect of this will be to reduce the desensitisation and distortion in the output at 43, caused by the strong interferer, of the in-band signals. The active loop circuit will be especially effective in reducing adverse effects of out of band interferers which are not adequately attenuated by the filters 32 and 33 and the duplexer 27.

Figure 5:
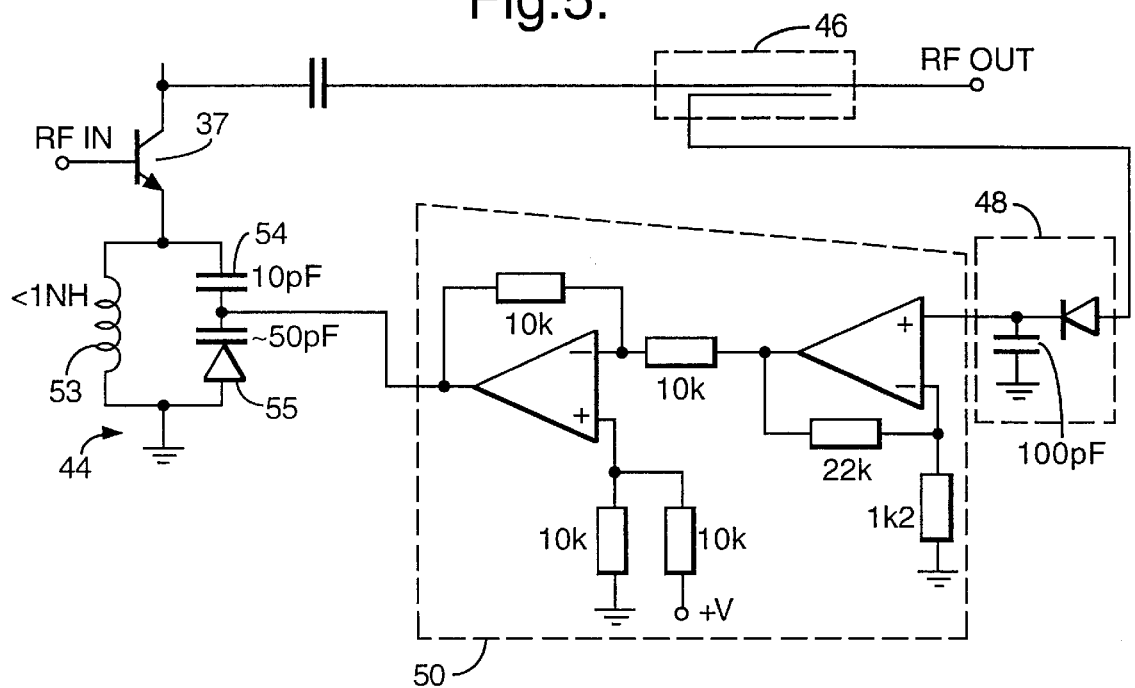
FIG. 5 shows in more detail one example of an adaptive loop circuit.

FIG. 5 shows in more detail one example of a suitable adaptive loop circuit, using the same reference numerals as FIGS. 1 to 4.

For a typical circuit a suitable value of the inductance may be from 0 to 2.5 nH. The voltage at 52 may rise from 0 V to around 5 V when the adaptive loop is actuated by a strong interferer. The action of the loop improves the linearity of the amplifier 37 especially a t high signal levels, with the aim of maintaining the amplifier in a substantially linear mode of operation. As the link between the emitter of the transistor and earth becomes more inductive th e gain of the amplifier will tend to reduce, which may result in an increase in the noise figure of the receiver. However, because of the preceding gain stages the overall change in the noise figure is likely to be minimal. In order to help minimise the reduction of gain at high frequencies the resistance between the emitter and earth (including any stray resistances in the components of the resonant circuit) should be as low as possible.

The adaptive loop may be arranged so that at lower signal strengths (e.g. −90 dBm) the loop is not (or is barely) actuated, because zero volts (or only a little over zero volts) is output from the detector and so the emitter of the transistor 37 is close to earth. Thus, it may be arranged so that at relatively low signal strengths the loop has little or no significant effect on the linearity of the amplifier. As signal strength rises the effective inductance of the resonant circuit 44 increases. The loop may cause higher effective inductances between earth and the emitter for signal strengths of greater than, say, −15 dBm; and possibly up to, say, 5 dBm.

The coupler 46 could be located (at 56 in FIG. 3) after the filter 34 that follows the amplifier 37, to sense the output of that filter rather than the direct output of the amplifier 37. The adaptive loop 41 could be applied to any of the amplifiers of the chain—sensing the output of that amplifier or a signal dependent on that output and controlling the IIP3 of that amplifier. It is preferable for the amplifier to which the loop is applied to be further from the antenna, most preferably the last amplifier of the chain, as in FIG. 3.

Figure 6:
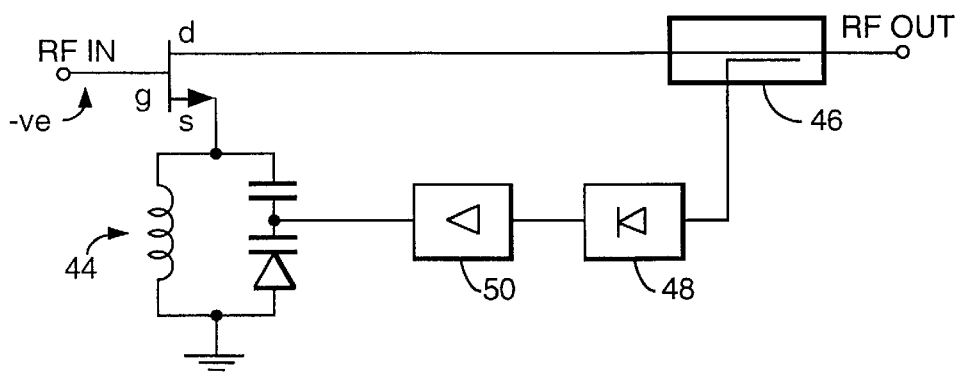
FIG. 6 shows a circuit analogous to that of FIG. 4 for the situation where the amplifier is a field effect transistor (FET).

FIG. 6 shows a circuit analogous to that of FIG. 4 for the situation where the amplifier is a FET. Similar components are numbered as for FIGS. 1 to 5.

The present invention includes any novel feature or combination of features disclosed herein either explicitly or implicitly or any generalisation thereof irrespective of whether or not it relates to the claimed invention or mitigates any or all of the problems addressed. In view of the foregoing description it will be evident to a person skilled in the art that various modifications may be made within the scope of the invention. For example, it will be apparent that in analogous amplifiers other than bipolar transistors and FETs the variable reactance means could be advantageously be connected to the terminal of the amplifier that is analogous to an emitter or source.

What is claimed is:

1. An amplifier system for a radio receiver, comprising:
a band-pass filter for filtering an input signal;
an amplifier for amplifying a signal applied by the band-pass filter to an input of the amplifier to generate an amplifier output signal;
a variable reactance means comprising an inductance coupled between the emitter or source of the amplifier and a ground voltage; and
a feedback loop for sensing the amplifier output signal and, in response to a relatively high level of the output signal, controlling the reactance of the variable reactance means to maintain the amplifier in a substantially linear mode of operation in the presence of interference from a signal in said input signal lying substantially outside of the pass band of the bandpass filter.

2. An amplifier system for a radio receiver, comprising:
a band-pass filter for filtering an input signal;:
an amplifier for amplifying a signal applied by the band-pass filter to an input of the amplifier to generate an amplifier output signal;
a variable reactance means coupled between the emitter or source of the amplifier and a ground voltage;
a feedback loop for sensing the amplifier output signal and, in response to a relatively high level of the output signal, controlling the reactance of the variable reactance means to maintain the amplifier in a substantially linear mode of operation in the presence of interference from a signal in said input signal lying substantially outside of the pass band of the bandpass filter; and
wherein the variable reactance means comprises a resonant circuit.

3. An amplifier system as claimed in claim 2, wherein the resonant circuit comprises a varactor.

4. An amplifier system for a radio receiver, comprising:
a band-pass filter for filtering an input signal;
an amplifier for amplifying a signal applied by the band-pass filter to an input of the amplifier to generate an amplifier output signal;
a variable reactance means coupled between the emitter or source of the amplifier and a ground voltage;
a feedback loop for sensing the amplifier output signal and, in response to a relatively high level of the output signal, controlling the reactance of the variable reactance means to maintain the amplifier in a substantially linear mode of operation in the presence of interference from a signal in said input signal lying substantially outside of the pass band of the bandpass filter;
wherein the variable reactance means comprises a resonant circuit, and the resonant circuit comprises a varactor; and
the feedback loop comprises sensing means for sensing the level of the output signal and the capacitance of the varactor is controlled by a voltage derived from the output of the sensing means.

5. An amplifier system as claimed in claim 2, wherein the resonant circuit comprises an inductance and a capacitance connected in parallel.

6. An amplifier system as claimed in claim 2, wherein the resonant circuit includes a reactance provided by a via hole.

7. An amplifier system for a radio receiver, comprising:
a band-pass filter for filtering an input signal;
an amplifier for amplifying a signal applied by the band-pass filter to an input of the amplifier to generate an amplifier output signal;
a variable reactance means coupled between the emitter or source of the amplifier and a ground voltage;
a feedback loop for sensing the amplifier output signal and, in response to a relatively high level of the output signal, controlling the reactance of the variable reactance means to maintain the amplifier in a substantially linear mode of operation in the presence of interference from a signal in said input signal lying substantially outside of the pass band of the bandpass filter; and
wherein the reactance means includes an element which varies an amount of capacitance in response to a control voltage and, in response to a relatively high level of the output signal the feedback loop causes the effective inductance of the variable reactance means to increase.

8. An amplifier system as claimed in claim 1, wherein the feedback loop is sensitive to the voltage of the amplifier output signal.

9. An amplifier system as claimed in claim 1, wherein the amplifier comprises a transistor.

10. An amplifier system as claimed in claim 9, wherein the amplifier comprises a bipolar transistor and the variable reactance means is coupled between the emitter of the transistor and the ground voltage.

11. An amplifier system as claimed in claim 9, wherein the amplifier comprises a field effect transistor and the variable reactance means is coupled between the source of the transistor and the ground voltage.

12. An amplifier system as claimed in claim 1, comprising a second amplifier for amplifying a received signal and having its output coupled to the said amplifier input.

13. An amplifier system as claimed in claim 12, wherein the two said amplifiers comprise a chain of at least three amplifiers.

14. An amplifier system as claimed in claim 1, comprising an antenna for receiving radio signals and coupled to the said amplifier input.

15. An amplifier system as claimed in claim 1, comprising mixer means having an input coupled to receive a signal that is dependent on the amplifier output signal.

16. An amplifier system for a radio transceiver, comprising:

an amplifier for amplifying a signal applied to an amplifier input to generate an amplifier output signal;

a variable reactance means comprising an inductor directly connected between the emitter or source of the amplifier and a ground voltage; and a feedback loop for sensing the amplifier output signal and, in response to a relatively high level of the output signal, controlling the reactance of the variable reactance means to maintain the amplifier in a substantially linear mode of operation.

17. An amplifier system for a radio transceiver, comprising:

an amplifier for amplifying a signal applied to an amplifier input to generate an amplifier output signal;

a variable reactance means having an inductance and a minimum resistance, coupled between the emitter or source of the amplifier and a ground voltage; and a feedback loop for sensing the amplifier output signal and, in response to a relatively high level of the output signal, controlling the reactance of the variable reactance means to maintain the amplifier in a substantially linear mode of operation.

18. An amplifier system for a radio receiver, comprising:

a plurality of amplifiers and a plurality of band pass filters interconnecting the amplifiers for rejecting interference of an interfering signal lying essentially outside of a pass band of the filters, a first one of said amplifiers being connected to an antenna of the radio receiver;

wherein a last one of said amplifiers includes an amplifying element having an emitter or source terminal with a variable reactance means coupled between the emitter or source terminal and a ground terminal;

wherein, said reactance means comprise a resonant circuit having inductance and capacitive elements of which one of the elements has a variable impedance selectable in response to a control signal voltage; and wherein, the amplifier system further comprises a feedback loop sensing an output signal of said last amplifier to provide the control signal voltage and, in response to a relatively high level of the output signal indicative of the presence of interference from said interfering signal, controlling the reactance of said variable reactance means to maintain the amplifier in a substantially linear mode of operation.

* * * * *